(12) United States Patent
Horigome

(10) Patent No.: US 6,446,331 B1
(45) Date of Patent: Sep. 10, 2002

(54) MOUNTING APPARATUS OF ELECTRONIC COMPONENTS AND MOUNTING METHODS OF THE SAME

(75) Inventor: Naoyuki Horigome, Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/364,457

(22) Filed: Jul. 30, 1999

(30) Foreign Application Priority Data

Jul. 30, 1998 (JP) .......................................... 10-215237

(51) Int. Cl.[7] ................................................ H05K 3/30
(52) U.S. Cl. .............................. 29/832; 29/712; 29/740; 29/743; 29/833; 29/721
(58) Field of Search ........................ 29/740, 832, 840, 29/712, 833, 721, 743

(56) References Cited

U.S. PATENT DOCUMENTS

| | | | | |
|---|---|---|---|---|
| 5,402,564 A | * | 4/1995 | Tsukasaki et al. ............. | 29/740 |
| 5,452,509 A | * | 9/1995 | Suzuki et al. .................. | 29/740 |
| 5,727,311 A | * | 3/1998 | Ida et al. ....................... | 29/740 |
| 5,740,604 A | * | 4/1998 | Kitamura et al. .............. | 29/740 |
| 5,743,005 A | * | 4/1998 | Nakao et al. ................... | 29/740 |
| 5,778,525 A | * | 7/1998 | Hata et al. | |
| 5,933,942 A | * | 8/1999 | Kitamura et al. | |
| 5,979,045 A | * | 11/1999 | Nishimori et al. | |
| 6,058,509 A | * | 5/2000 | Hanamura | |

* cited by examiner

Primary Examiner—Carl J. Arbes
(74) Attorney, Agent, or Firm—Ratner & Prestia

(57) ABSTRACT

An electronic component mounting apparatus and an electronic component mounting method are provided which improve the productivity by reducing the cycle time. The electronic component mounting method includes the steps of a) picking up an electronic component from a first supplying section or a second supplying section respectively disposed on each side of a substrate, b) recognizing the electronic component by a recognition section, and c) moving and mounting the electronic component on the substrate. Frequently used electronic components are stored in both of the first and second supplying sections. The electronic components are picked up from the first supplying section and mounted on the substrate in the normal operating conditions. When the electronic components stored in the first supplying section run out, the same kind of components are provided by the second supplying section to continue the mounting operation. In the mean time, the first supplying section is replenished with the electronic components, and when replenishment is completed, the electronic components are again, provided by the first supplying section, to continue the mounting operation. Thereby, carriage distance in the normal operating conditions becomes shorter which reduces the cycle time.

10 Claims, 5 Drawing Sheets

MOUNTING APPARATUS OF ELECTRONIC COMPONENTS AND MOUNTING METHODS OF THE SAME

FIELD OF THE INVENTION

The present invention relates to an apparatus and methods for mounting electronic components on a substrate.

BACKGROUND OF THE INVENTION

Apparatuses for mounting electronic components, such as semiconductor chips onto a substrate, have electronic-component supplying sections where a number of parts feeders supplying electronic components are provided. In many cases, the electronic-component supplying sections are provided not only one side but both sides of the holding section of the substrate which is to be loaded with the electronic components, in order to accommodate the number of kinds of the electronic components to be mounted on the substrate. Another reason for the electronic-component supplying sections to be provided on both sides of the substrate holding section is to store the largest possible number of electronic components.

In the process of mounting the electronic component, in general, the positioning of the electronic component is corrected by capturing an image of the electronic components being held by a mounting head and by recognizing that image. The purpose of the foregoing process is to improve the positioning accuracy upon mounting the electronic component onto the substrate. To carry out the image recognition, the electronic component mounting apparatus is provided with a recognition section which captures and recognizes an image of the electronic component.

It is useful to have the image recognition section disposed adjacent to the route of the mounting head holding the electronic component, from the supplying sections to the substrate. Therefore, it is desirable for the image recognition sections to be disposed on both sides of the substrate holding section, when the supplying sections are provided, as is the foregoing case, on both sides of the substrate holding section. However, the image recognition section contains expensive devices. In many cases, therefore, only one image recognition section is provided to one side of the substrate holding section, to avoid increased cost of the apparatus.

As a result, the routes of the mounting head differ significantly depending on whether the electronic component is picked up from the supplying section provided with the image recognition section or from the other supplying section. In other words, when the mounting head picks up the electronic component from the supplying section without the image recognition section and mounts it onto the substrate, the mounting head, after picking up the electronic component, has to pass over the substrate to the image recognition section and then move back above the substrate. Therefore, otherwise unnecessary, extra movement is required, resulting in a longer carriage time and cycle time, and in turn, hindering an improvement in productivity.

The present invention aims at providing electronic component mounting methods which improve the productivity by reducing the cycle time.

SUMMARY OF THE INVENTION

An electronic component mounting method of the present invention includes the steps of; a) picking up an electronic component by a mounting head from a first supplying section and a second supplying section, each having a number of parts feeders, disposed on both sides of the substrate holding section for holding a substrate, b) recognizing the electronic component by a recognition section provided between the substrate holding section and the first supplying section, and c) moving and mounting the electronic component on the substrate held in the substrate holding section, wherein, the same kind of electronic components used in large numbers are stored in both of the first supplying section and the second supplying section.

An electronic component mounting apparatus of the present invention comprises following elements: a) a substrate holding section for holding a substrate; b) a first supplying section and a second supplying section, each having a number of parts feeders, disposed on both sides of the substrate holding section, each of the first supplying section and the second supplying section comprising; i) a table on which the parts feeders are disposed, ii) means for moving the table up and down, and iii) position determining means for determining the height direction position of the parts feeders when the table ascends, c) a mounting head for picking up an electronic component from the first and the second supplying sections; and d) a recognition section for recognizing the electronic component being held by the mounting head.

According to the present invention, the same kind of electronic components used in large numbers, is stored in both the first supplying section disposed adjacent to the recognition section on one side of the substrate holding section and the second supplying section disposed on the other side of the substrate holding section without the recognition section. The electronic components are picked up from the first supplying section in the normal operating conditions. The electronic components are picked up from the second supplying section only when the electronic components stored in the first supplying section run out. Thereby, the carriage distance in the normal operating conditions becomes shorter, reducing the cycle time.

DESCRIPTION OF THE PREFERRED EMBODIMENT

The preferred embodiment of the present invention is described hereinafter, with reference to the accompanying drawings.

Figure 1:
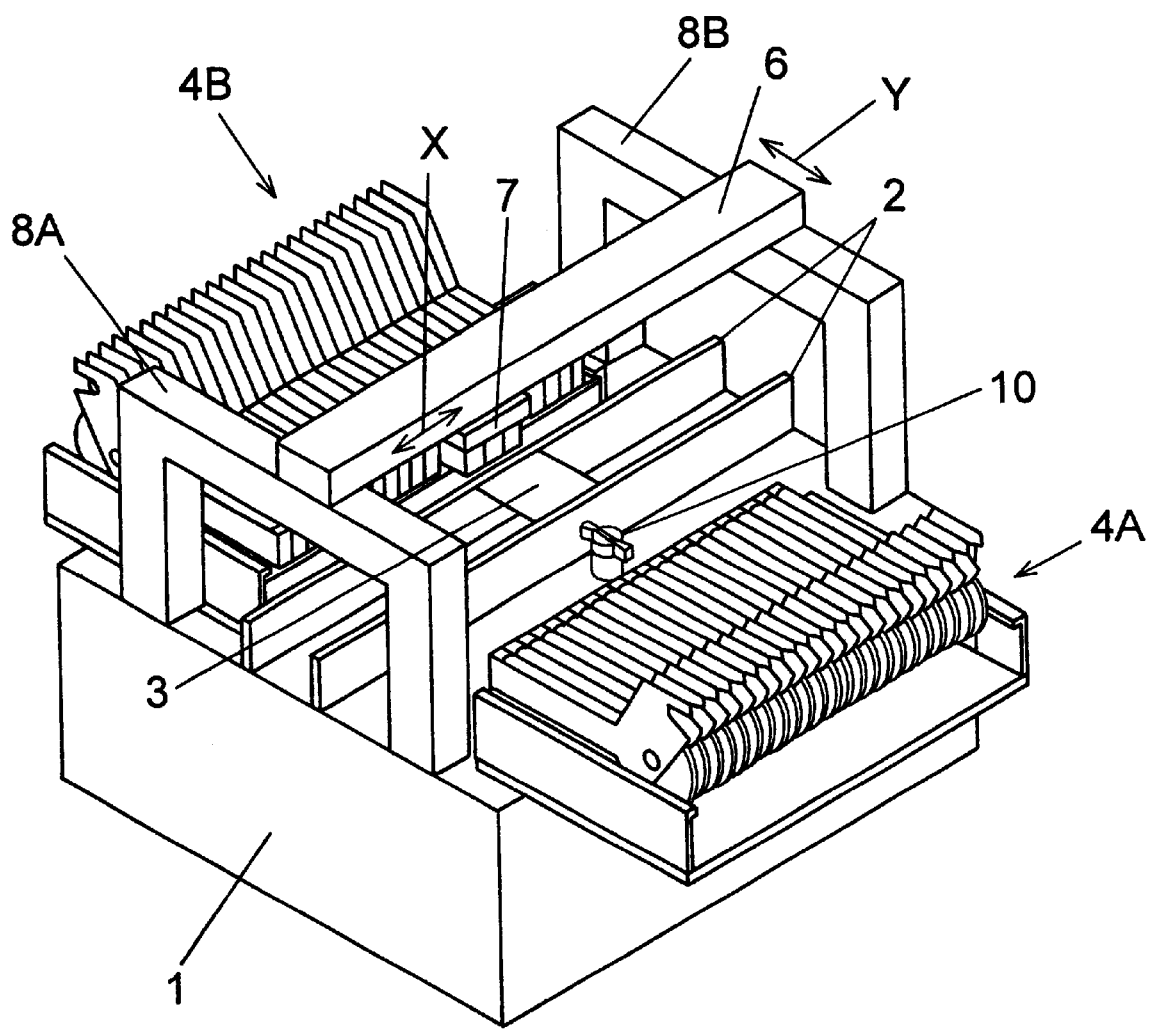
FIG. 1 shows a perspective view of an electronic component mounting apparatus according to the preferred embodiment of the present invention.
Figure 2:
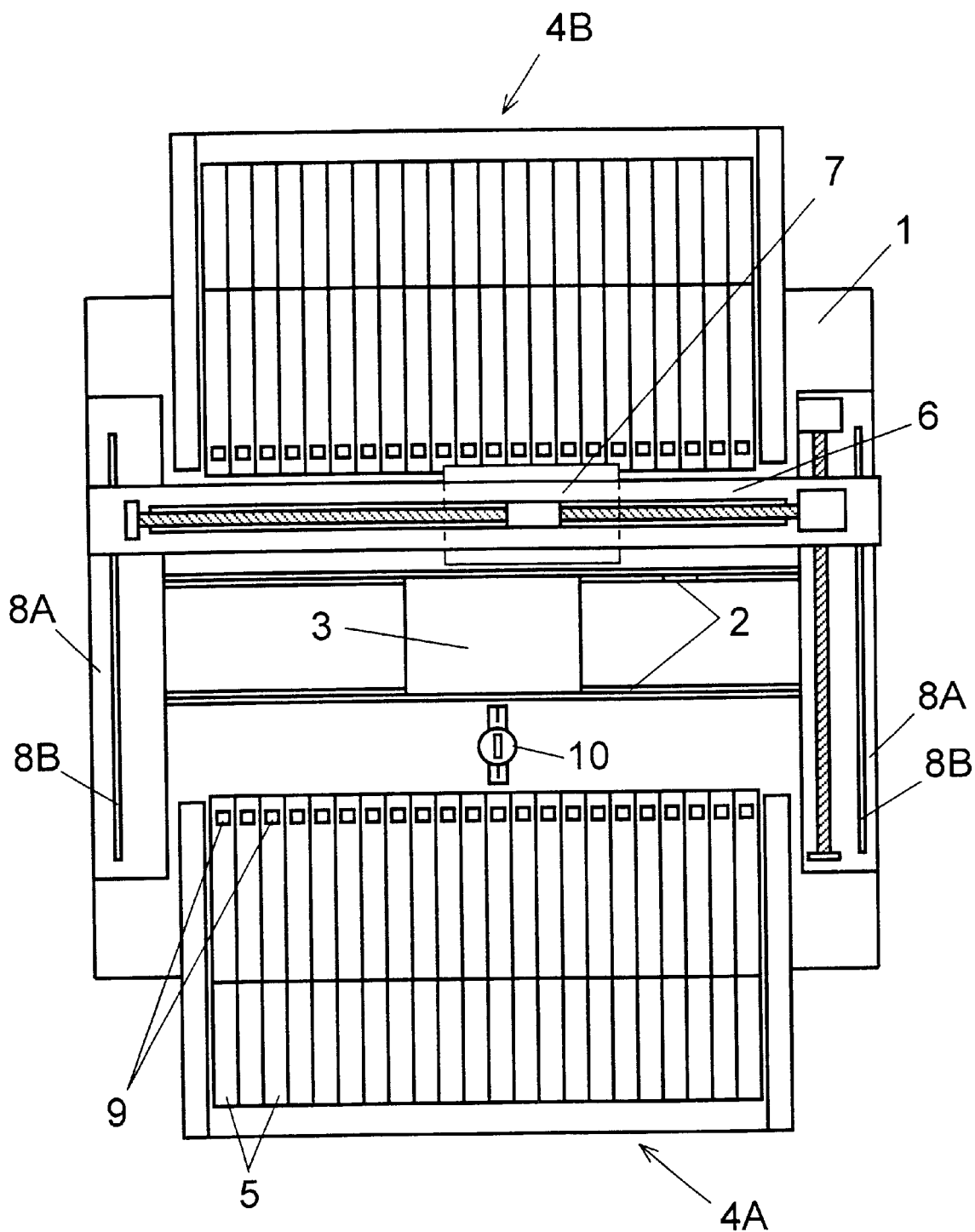
FIG. 2 shows a plan view of the electronic component mounting apparatus according to the preferred embodiment of the present invention.

First, the electronic component mounting apparatus is described referring to FIG. 1 and FIG. 2. In FIG. 1, conveying rails 2 are disposed in the X direction (an arrow in FIG. 1) on the center of a base 1. The conveying rails 2 convey a substrate 3 and determine its position. Therefore, the conveying rails 2 function as a holding section on which a substrate is held. First and second supplying sections 4A and 4B for supplying the electronic components are disposed on both sides of the conveying rails 2. A number of tape feeders 5 functioning as parts feeders are disposed in the first and second supplying sections 4A and 4B. The tape feeders 5 store electronic components held on a tape. By pitch-sending the tape, the tape feeders 5 supply electronic components.

A mounting head 7 for mounting the electronic components is provided onto an X axial table 6. The X axial table 6 bridges a Y axial table 8A and a guide 8B disposed parallel to the Y axial table 8A, which support both ends of the X axial table 6. This construction allows, by driving the X axial table 6 and the Y axial table 8A, the mounting head 7 to move horizontally. A nozzle 7a disposed on the bottom of the mounting head 7 (refer to FIGS. 3 and 4) picks up the electronic component from a pick-up position 9 of the tape feeder 5. The electronic component is mounted on the substrate 3. A recognition section 10, which recognizes the electronic component, is disposed between the conveying rails 2 and the first supplying section 4A.

This preferred embodiment describes an example, as shown in FIGS. 1 and 2 for simplification, where one supplying section is disposed on each side of the substrate holding section for holding the substrate 3, in other words the first supplying section 4A on one side and second supplying section 4B on the other side. However, it is understood that a plurality of supplying sections can be included on each side of the substrate holding section for holding the substrate 3, in other words, a plurality of supplying sections including the first supplying section 4A on one side and a plurality of supplying sections including the second supplying section 4B on the other side.

In FIGS. 1 and 2, the recognition section 10 is provided between the substrate holding section for holding the substrate 3 and the first supplying section 14A. When a plurality of the supplying sections are provided on both sides of the substrate holding section, however, the recognition section 10 can be provided directly between two of the supplying sections on the side of the substrate holding section. Namely the recognition section 10 is provided at a side of said substrate holding section facing said first supplying section.

Figure 3:
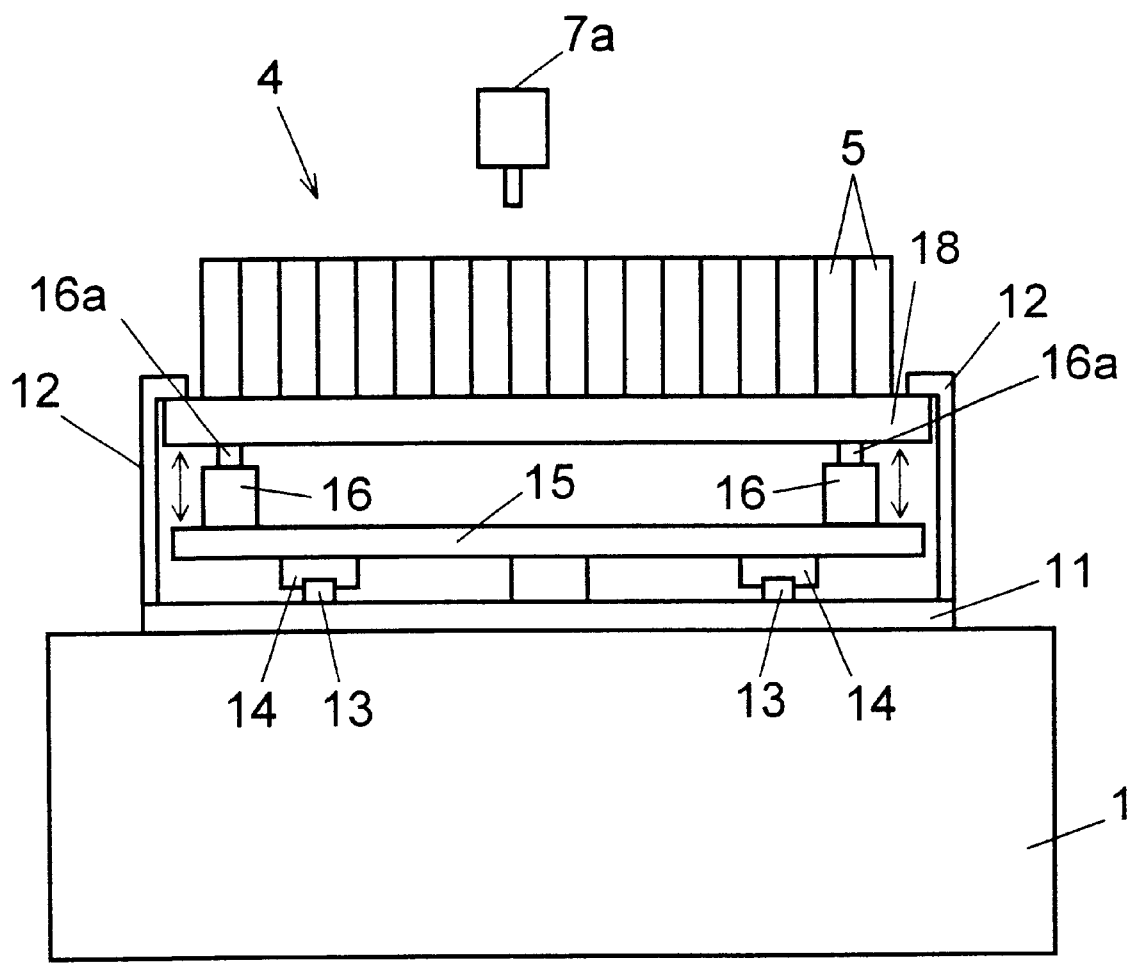
FIG. 3 shows a front view of the electronic component mounting apparatus according to the preferred embodiment of the present invention.

The first and second supplying sections 4A and 4B are described hereinafter with reference to FIGS. 3 and 4. In FIG. 3, a base plate 11 is fixed onto the base 1. Two guide rails 13 are provided parallel to each other onto the base plate 11. A plate 15 is fixed to sliders 14 which are fitted horizontally to the guide rails 13 in a manner that it can slide freely. Two cylinders 16 are provided perpendicularly onto the top surface of the plate 15. A table 18 is connected to the tip of rods 16a of the cylinders 16. A number of the tape feeders 5 are provided on the table 18. Stopper brackets 12 which are reverse-L shaped, are provided perpendicularly onto both ends of the base plate 11. When the rods 16a of the cylinders 16 are protruding, the tips of the top face of the table 18 touch the stopper brackets 12, thereby determining the height-direction position of the tape feeders 5.

Figure 4:
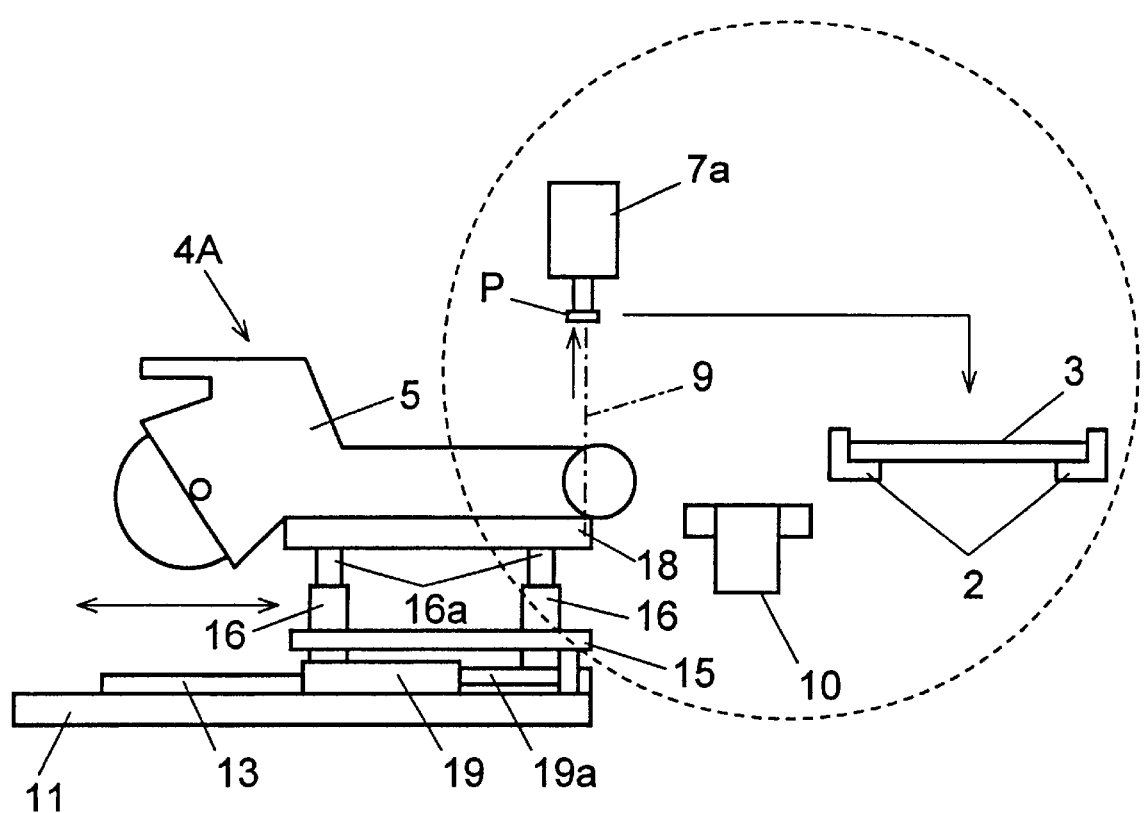
FIG. 4 shows a side view of the electronic component mounting apparatus according to the preferred embodiment of the present invention.

In FIG. 4, a cylinder 19 is provided onto the base plate 11 horizontally. A rod 19a of the cylinder 19 is connected to the plate 15. As the rod 19a of the cylinder 19 moves in and out, the plate 15 reciprocates horizontally. When the rod 19a is protruding, the first and second supplying sections 4A and 4B are positioned ready for the nozzle 7a to pick up the electronic component. When the rod 19a is depressed, the whole body of the first and second supplying sections 4A and 4B protrude outwards into the area where replenishment of the electronic components can be conducted safely. In this regard, the cylinder 19 is functioning as means for pulling out the first and second supplying sections 4A and 4B.

As FIG. 4 shows, the nozzle 7a picks up an electronic component P from the pick-up position 9 of the tape feeder 5, and moves above the substrate 3 positioned on the conveying rails 2. On the route of the nozzle 7a, the recognition section 10 captures and recognizes an image of the electronic component P from below.

The electronic component mounting apparatus is constructed as described above. The operation of the same is described hereinafter. In FIG. 2, the substrate 3 is positioned on the mounting position on the conveying rails 2. The X axial table 6 and the Y axial table 8A are driven to move the mounting head 7. The mounting head 7 picks up an electronic component from the pick-up position 9 of the tape feeder 5 which supplies a predetermined electronic component. The mounting head 7 then moves above the recognition section 10 and position recognition of the electronic component is conducted. The position of the electronic component upon mounting onto the substrate 3, is corrected based on the result of the position recognition. Then, the electronic component is mounted on the substrate 3.

Figure 5A:
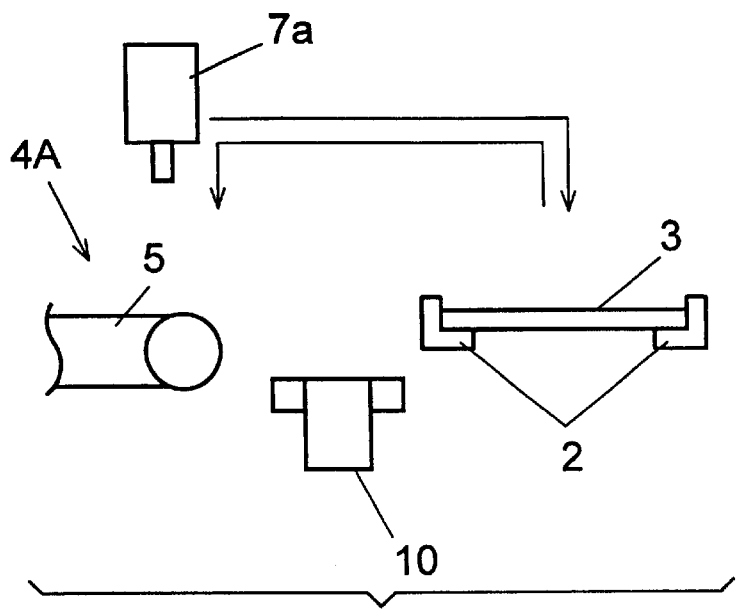
FIG. 5A shows a side view illustrating the route of a nozzle when it picks up the electronic component from a first supplying section of the electronic component mounting apparatus according to the preferred embodiment of the present invention.
Figure 5B:
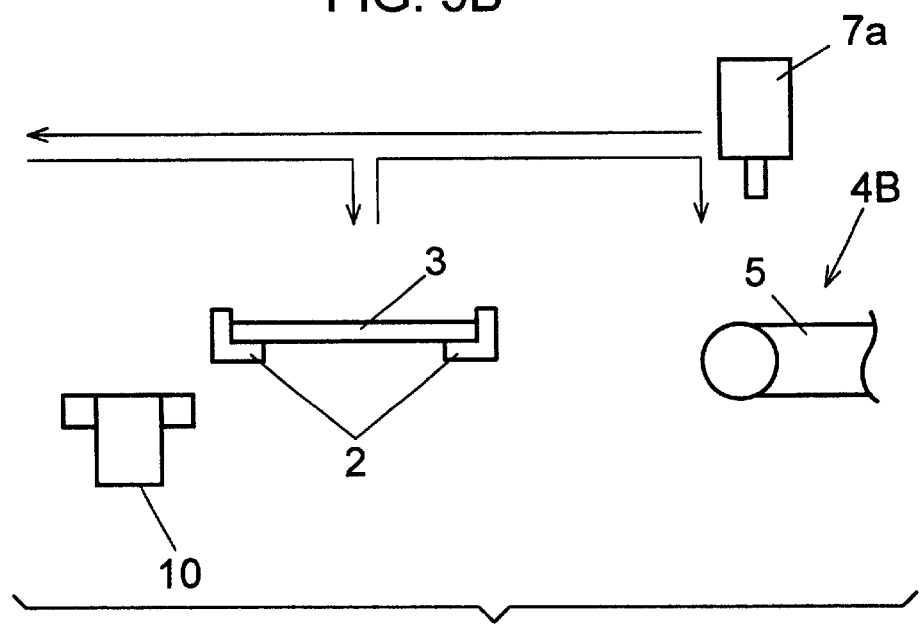
FIG. 5B shows a side view illustrating the route of the nozzle when it picks up the electronic component from a second supplying section of the electronic component mounting apparatus according to the preferred embodiment of the present invention.

The following describes the method for replenishing the electronic components in the mounting process with reference to FIGS. 5A and 5B. FIG. 5A and 5B show the route of the nozzle 7a with arrows when it picks up the electronic component P from the first supplying section 4A and the second supplying section 4B respectively. In the normal mounting operation, an electronic component is picked up from the first supplying section 4A as described in FIG. 5A. When the electronic components stored in the first supplying section 4A have run out and is detected, the same kind of electronic component is picked up from the second supplying section 4B to continue mounting. In the mean time, an operator replenishes the electronic components to the tape feeders 5 of the first supplying section 4A which had stored the electronic components having now run out.

The following is a description of a replenishment method of the electronic components. The first supplying section 4A is selected below for description, however, the same method can be applied to the second supplying section 4B. In FIG. 3, the rods 16a of the cylinders 16 descend, thereby lowering the table 18. Then the connection between the table 18 and the stopper brackets 12 is released, which enables the whole body of the first supplying section 4A to be pulled out. Then the rod 19a of the cylinder 19 is depressed to allow the first supplying section 4A to protrude outwards. In this state, a supply reel is changed and the electronic components which have run out are replenished to the tape feeders 5. During the replenishment operation, the mounting operation is continued without any interruption using the second supplying section 4B. Since the electronic components are supplied while the first supplying section 4A is protruded outwards as mentioned above, the replenishment operation can be conducted safely and efficiently while the mounting head 7 is in operation.

As it can be understood by comparing the routes of the nozzle 7a illustrated in FIGS. 5A and 5B, picking up an electronic component from the first supplying section 4A provided with the recognition section 10, requires a shorter route to mount the electronic component on the substrate 3 than picking up an electronic component from the second supplying section 4B. The total moving distance of the mounting head during the mounting operation can be reduced, and mounting efficiency can be improved by the following steps. The kind of electronic components used in large numbers thus required to be replenished frequently, are stored in both the first and second supplying sections 4A and 4B. The electronic components are picked up from the first supplying section 4A which allows a shorter moving distance in the normal operating conditions. When the electronic components stored in the first supplying section 4A run out, the electronic components are picked up from the second supplying section 4B. With the above-described steps the mounting operation does not have to be interrupted for replenishment of the electronic components.

In this preferred embodiment, cylinders and rods are used for moving the table 18 up and down, and reciprocating the plate 15 horizontally. However, it is not limited to cylinders and rods, and, needless to say, other reciprocating mechanisms such as rack and pinion or linkage mechanism can also be used.

In this preferred embodiment, the supplying sections disposed on both sides of the substrate holding section, are described as the first and second supplying sections respectively. However, the supplying sections disposed on both sides of the substrate holding section can be applicable to the cases having a plurality of supplying sections including the first supplying section on one side and a plurality of supplying sections including the second supplying section on the other side. In such a case, degrees of freedom in terms of replenishment of the electronic components is increased if each supplying section is independently provided with a base plate, guide rails and a slider etc.

According to this preferred embodiment, the same kind of electronic components used in large numbers, are stored in both the first supplying section disposed adjacent to the recognition section of electronic components on one side of the substrate holding section and the second supplying section disposed on the other side of the substrate holding section without the recognition section. The electronic components are picked up from the first supplying section in the normal operating conditions and mounted on the substrate. The electronic components are picked up from the second supplying section only when the electronic components stored in the first supplying section run out. Therefore, the mounting operation does not have to be interrupted during the replenishment of the electronic components. The carriage distance in the normal operating conditions can be reduced, thereby shortening the cycle time and improving the mounting efficiency.

What is claimed is:

1. An electronic component mounting method comprising the steps of;
   a) obtaining electronic components from a first parts feeder included in a supplying section including a first supplying section on a first side of a substrate holding section using a mounting head;
   b) recognizing said electronic components using a recognition section, said recognition section disposed on said first side of said substrate holding section;
   c) mounting said electronic components on a substrate held by said substrate holding section;
   d) obtaining at least one additional electronic component from a second parts feeder included in a second supplying section on a second side of said substrate holding section using said mounting head;
   e) recognizing said at least one additional electronic component using said recognition section; and
   f) mounting said at least one additional electronic component on a substrate held by said substrate holding section.

2. The electronic component mounting method as set forth in claim 1, wherein electronic components of a first type are provided in said first supplying section and said second supplying section, and said electronic components of said first type are required in large numbers.

3. The electronic component mounting method as set forth in claim 1, wherein said electronic components are obtained from said supplying section including said second supplying section and are mounted on said substrate when said first supplying section is depleted of electronic components.

4. The electronic component mounting method as set forth in claim 3, further comprising the steps of;
   a) replenishing said first supplying section which has been depleted of electronic components with electronic components of the first type, and
   b) resuming the obtaining of electronic components from said first supplying section so as to continue mounting said electronic components.

5. The electronic component mounting method as set forth in claim 3, further comprising the steps of;
   resuming the obtaining of electronic components from a supplying section having a supply of electronic components when another of said supplying sections has been depleted of electronic components.

6. The electronic component mounting method as set forth in claim 5, further comprising the steps of;
   displacing said supplying section depleted of said electronic components by displacing means to a location where a replenishing operation can be conducted; and
   replenishing said supplying section depleted of said electronic components;
   obtaining and mounting of said electronic components continues from said supplying section with a supply of said electronic components while said supplying section depleted said electronic components is replenished.

7. An electronic component mounting method comprising the steps of;
   a) obtaining electronic components from a first supplying section disposed on a first side of a substrate holding section using a mounting head;
   b) recognizing said electronic components using a recognition section, said recognition section disposed on said first side of said substrate holding section;
   c) mounting the electronic components on a substrate held by said substrate holding section;
   d) obtaining at least one additional electronic component from a second supplying section disposed on a second side of said substrate holding section using said mounting head;
   e) recognizing said at least one additional electronic component using said recognition section; and
   f) mounting said at least one additional electronic component on said substrate held by said substrate holding section.

8. The electronic component mounting method of claim 7, additionally comprising the steps of:
   i) providing a same type of electronic component in both said first supplying section and said second supplying section, ii) mounting the electronic components onto said substrate from said first supplying section, iii) mounting electronic components from said second supplying section, when the supply of electronic components in said first supplying section is depleted, iv) replenishing said first supplying section with the electronic components, and v) continuing to mount electronic components from said first supplying section.

9. An electronic component mounting method comprising the steps of;

a) obtaining electronic components from a plurality of supplying sections disposed on sides of a substrate holding section, said components being obtained from said plurality of supplying sections by a single mounting head, b) recognizing said components using a recognition section disposed on one of said sides of said substrate holding section, c) mounting the electronic components on said substrate held in said substrate holding section, and continuing to mount the electronic components from supplying sections with electronic components while one of said supplying sections is depleted of the electronic components, said electronic mounting method further comprises the steps of;

i) displacing said supplying section depleted of electronic components by displacing means to a location where a replenishing operation can be conducted, and ii) replenishing the depleted electronic components to said supplying section depleted of electronic components.

10. The electronic component mounting method as set forth in claim 9, further comprising the step of lowering said supplying section depleted of electronic components before said supplying section is displaced to said location where the replenishing operation can be conducted.

* * * * *